US006198353B1

United States Patent
Janesch et al.

(10) Patent No.: US 6,198,353 B1
(45) Date of Patent: Mar. 6, 2001

(54) PHASE LOCKED LOOP HAVING DIRECT DIGITAL SYNTHESIZER DIVIDERS AND IMPROVED PHASE DETECTOR

(75) Inventors: Stephen T. Janesch, Coopersburg; Carl R. Stevenson, Macungie, both of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/368,493

(22) Filed: Aug. 5, 1999

(51) Int. Cl.[7] ............................. H03L 7/085; H03L 7/18
(52) U.S. Cl. ................... 331/16; 331/17; 331/18; 331/25
(58) Field of Search ..................... 331/18, 25, 17, 331/16

(56) References Cited

U.S. PATENT DOCUMENTS

| 4,965,533 | * | 10/1990 | Gilmore ........................... 331/18 |
| 5,130,671 | * | 7/1992 | Shahriary et al. ................. 331/16 |
| 5,329,253 | * | 7/1994 | Ichihara ........................... 331/17 |

* cited by examiner

Primary Examiner—Siegfried H. Grimm
(74) Attorney, Agent, or Firm—William H. Bollman

(57) ABSTRACT

A digital phase locked loop (PLL) frequency synthesizer having the conventional voltage controlled oscillator (VCO) divider in the feedback loop to the phase detector replaced with a direct digital synthesizer (DDS) divider. In accordance with the principles of the present invention, the reference divider in the input path may also be replaced with a DDS divider. Moreover, a new architecture for the phase detector and current digital-to-analog converter (DAC) which operate on the instantaneous phase of each DDS is provided. Thus, in accordance with the principles of the present invention, the update rate of the digital PLL frequency synthesizer is not based on the frequency signal output from the reference divider in the input path (as in conventional digital PLL frequency synthesizer architectures). Rather, the update rate is based on fixed clock signals output from the clock generator, which utilizes the master clock and the output frequency, in accordance with the principles of the present invention. The digital PLL frequency synthesizer is capable of a very high update rate, very fast settling time, and very fine frequency control.

20 Claims, 3 Drawing Sheets

PLL SYNTHESIZER WITH DDS DIVIDERS AND IMPROVED PHASE DETECTOR

DIRECT DIGITAL SYNTHESIZER

TYPICAL PLL FREQUENCY SYNTHESIZER

PHASE LOCKED LOOP HAVING DIRECT DIGITAL SYNTHESIZER DIVIDERS AND IMPROVED PHASE DETECTOR

BACKGROUND OF THE INVENTION

1. Field of the Invention

This invention relates generally to a phase locked loop. More particularly, it relates to an architecture for a digital phase locked loop frequency synthesizer which is capable both of synchronizing frequencies on a fine resolution basis, and of a fast settling time at each selected frequency.

2. Background of Related Art

A phase locked loop (PLL) is a device which is capable of outputting a synthesized frequency locked to an input master frequency signal. A conventional phase locked loop (PLL) frequency synthesizer is a device which generates (i.e., synthesizes) an output signal whose frequency is a rational multiple of the known, stable input master frequency signal.

Conventionally, there is a fundamental tradeoff in conventional PLL frequency synthesizer design between the resolution of channel spacing (frequency control) and settling time. One primary parameter involved in the tradeoff is the reference frequency or update rate of a phase detector used in the PLL.

A block diagram of a conventional PLL frequency synthesis is shown in FIG. 3.

In FIG. 3, a conventional digital PLL comprises a master clock 302 generating a master frequency signal $f_{MASTER}$. A reference frequency divider 304 divides the master clock signal $f_{MASTER}$ by an integer value R.

A phase detector 306, a charge pump 308, and a loop filter 310 provide a voltage signal to a voltage controlled oscillator (VCO) to cause a voltage controlled oscillator (VCO) 312 to output a particular frequency signal.

A VCO frequency divider 314 is placed in a feedback loop between the output of the VCO 312 and one input to the phase detector 306. The VCO frequency divider 314 divides by an integer value X.

The PLL forms a control loop which, when locked, forces the phase difference of the two signals applied to the phase detector to zero. Two signals whose phases are locked - either to a zero offset or some constant offset - are also equal in frequency.

In particular, the PLL takes as an input a stable master frequency signal frequency $f_{MASTER}$ generated by, e.g., a master oscillator 302. The input master frequency signal $f_{MASTER}$ is divided by the reference frequency divider 304, which typically is a programmable down-counter, to provide a reference signal with frequency $f_{REF}$ shown in Equation (1) below:

$$f_{REF} = \frac{1}{R} f_{MASTER}$$

The reference frequency signal $f_{REF}$ is applied to one input of the phase detector 306.

The output of the frequency synthesizer is taken from the VCO 312. The VCO 312 is tunable over a range of frequencies, for uses such as when tuning the channels of an FM radio, or when selecting any of a plurality of different channels over which a cordless telephone operates.

The output signal from the VCO 312 is divided to what is ideally the reference frequency $f_{REF}$ by the programmable frequency divider 314. (The VCO frequency divider 314 is embodied as an asynchronous divider, a synchronous down-counter, or a combination of the two for frequencies greater than 100 MHz such as in a dual modulus pre-scaler or divider followed by one or more down-counters.)

The divided output signal is fed back to a second input of the phase detector 306.

Thus, the output of the R and X dividers are applied to the phase detector, which, along with the charge pump, generates an error signal proportional to the difference in phase between the two inputs.

The loop filter is a lowpass filter critical in settling phase noise and settling time of the loop.

In operation, the synthesized output frequency of the VCO 312 can be changed simply by reprogramming the division factor of the feedback VCO divider 314.

The phase detector error is zero when the X and R outputs are identical in phase (and therefore also frequency). Accordingly, the output frequency signal from the VCO 312 and thus from the PLL frequency synthesizer will be X times the reference frequency $f_{REF}$, with X being an integer.

When the PLL is locked, the input to the phase detector is also at the reference frequency $f_{REF}$, as shown in Equation (2) below:

$$f_{REF} = \frac{1}{X} f_{VCO}$$

Solving Equations (1) and (2) for the frequency signal $f_{vco}$ output from the VCO 312 provides Equation (3) shown below:

$$f_{VCO} = \frac{X}{R} f_{MASTER}$$

The phase detector 306 and the charge pump 308 provide an output frequency signal which is proportional to the phase error between its two inputs, i.e., the reference frequency signal $f_{REF}$ and the fedback VCO divided frequency signal. In response, the phase detector 306 generates an error signal whose duration is proportional to the delay between rising edges of its two inputs, i.e., between the reference frequency $f_{REF}$ and the fedback VCO divided signal.

The charge pump 308 functions like a pulse width modulated current digital-to-analog converter (DAC), modulated by the duration of the output of the phase detector 306.

The loop filter 310 is a lowpass filter, which integrates the current output from the charge pump 308 to become the control voltage signal applied to control the VCO 312. Generally, loop filter design impacts loop stability, phase noise, and settling time.

Fast settling time is of particular importance in systems where channels must be scanned during acquisition, and in frequency-hopped spread spectrum (FHSS) systems in particular. Unfortunately, settling time is inversely related to loop bandwidth, and thus loop bandwidth should typically be at least an order of magnitude lower than the reference frequency $f_{REF}$ to reduce spurious emissions produced by the reference frequency $f_{REF}$ and its harmonics.

Since the synthesized output frequency signal $f_{vco}$ is an integer multiple of the reference frequency $f_{REF}$ in a typical frequency synthesizer, the minimum tuning increment of the VCO 312 is equal to the reference frequency $f_{REF}$. Thus, it follows that channel spacing must conventionally be some integer multiple of the reference frequency $f_{REF}$. In other words, the maximum value of the reference frequency $f_{REF}$ for a particular system is equal to the channel spacing. Thus, channel spacing plays an important part in determining loop bandwidth and settling time.

In particular, in conventional PLL designs, the frequency output from the VCO 312 must be an integer multiple of the reference frequency $f_{REF}$. The result is that the smallest possible tuning increment or channel spacing is equal to the reference frequency $f_{REF}$, the second smallest possible tuning increment is equal to twice the reference frequency $f_{REF}$, etc.

When changing the output frequency from the PLL frequency synthesizer, i.e., when changing channels, it is most desirable that the PLL settle in on the new frequency as quickly as possible, i.e., as small a PLL settling time as possible is desired. However, because of the conventional tradeoff between reference frequency and settling time, some amount of settling time must be endured to accommodate a desired resolution in the output frequency based on the choice of reference frequency.

Low settling time is particularly attractive in portable, battery powered applications, where, for instance, scanning for an open channel or waiting for the PLL to settle when coming out of a sleep mode can be responsible for a significant portion of the standby current consumption. In such a system, to have many possible frequency channels, a lower reference frequency is required. However, to provide for a faster settling time, a higher reference frequency is required. The designer typically predetermines the value of the reference frequency based on a desired value of the settling time.

There is a need for a PLL design which allows for both smaller frequency channels (i.e., high frequency resolution) and fast settling time regardless of the value of the reference frequency.

SUMMARY OF THE INVENTION

In accordance with the principles of the present invention, a digital phase locked loop frequency synthesizer comprises a phase detector receiving at a first input a representation of a master frequency signal, and a voltage controlled oscillator. A VCO direct digital synthesizer is in a feedback loop between an output of the voltage controlled oscillator and a second input to the phase detector. The VCO direct digital synthesizer forms a first frequency divider.

A method of providing feedback between an output signal of a voltage controlled oscillator and an input signal to a phase detector in a digital phase locked loop in accordance with another aspect of the present invention comprises dividing the output signal from the voltage controlled oscillator with a VCO direct digital synthesizer having at least two-bit word length output samples. The divided output signal is provided to the input of the phase detector.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a digital phase locked loop (PLL) frequency synthesizer having the conventional voltage controlled oscillator (VCO) divider in the feedback loop to the phase detector replaced with a direct digital synthesizer (DDS) divider. In accordance with the principles of the present invention, the reference divider in the input path may also be replaced with a DDS divider. Moreover, the phase detector and current digital-to-analog converter (DAC) operate on the instantaneous phase of each DDS. The digital PLL frequency synthesizer is capable of a very high update rate, very fast settling time, and very fine frequency control.

Figure 1:
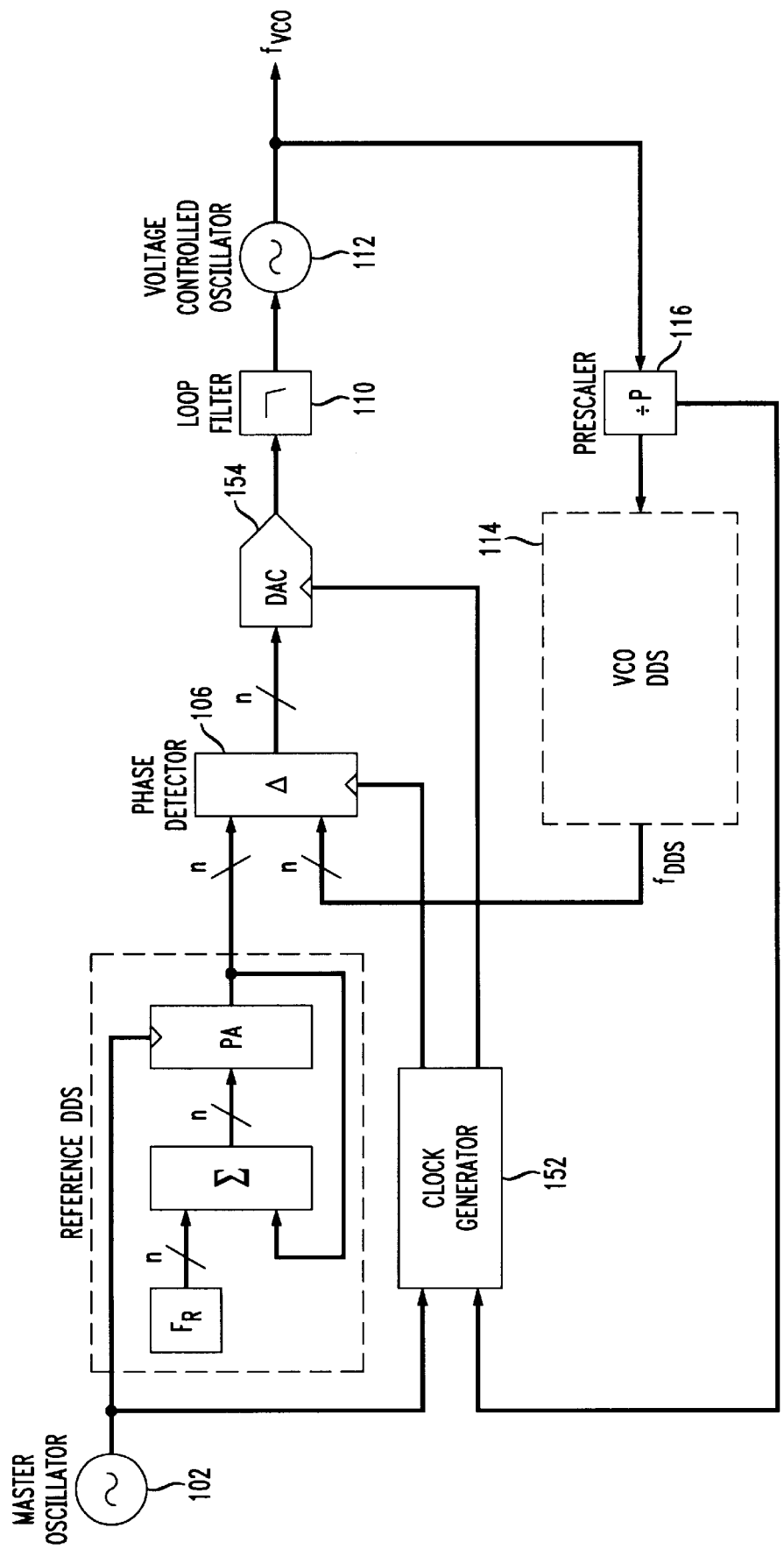
FIG. 1 shows a phase locked loop (PLL) frequency synthesizer including direct digital synthesis (DDS) dividers and an improved phase detector and an optional pre-scaler, in accordance with the principles of the present invention.

FIG. 1 shows a phase locked loop (PLL) frequency synthesizer including direct digital synthesis (DDS) dividers 104, 114, an improved phase detector architecture 106, and an optional pre-scaler 116 in a feedback path, in accordance with the principles of the present invention.

Figure 3:
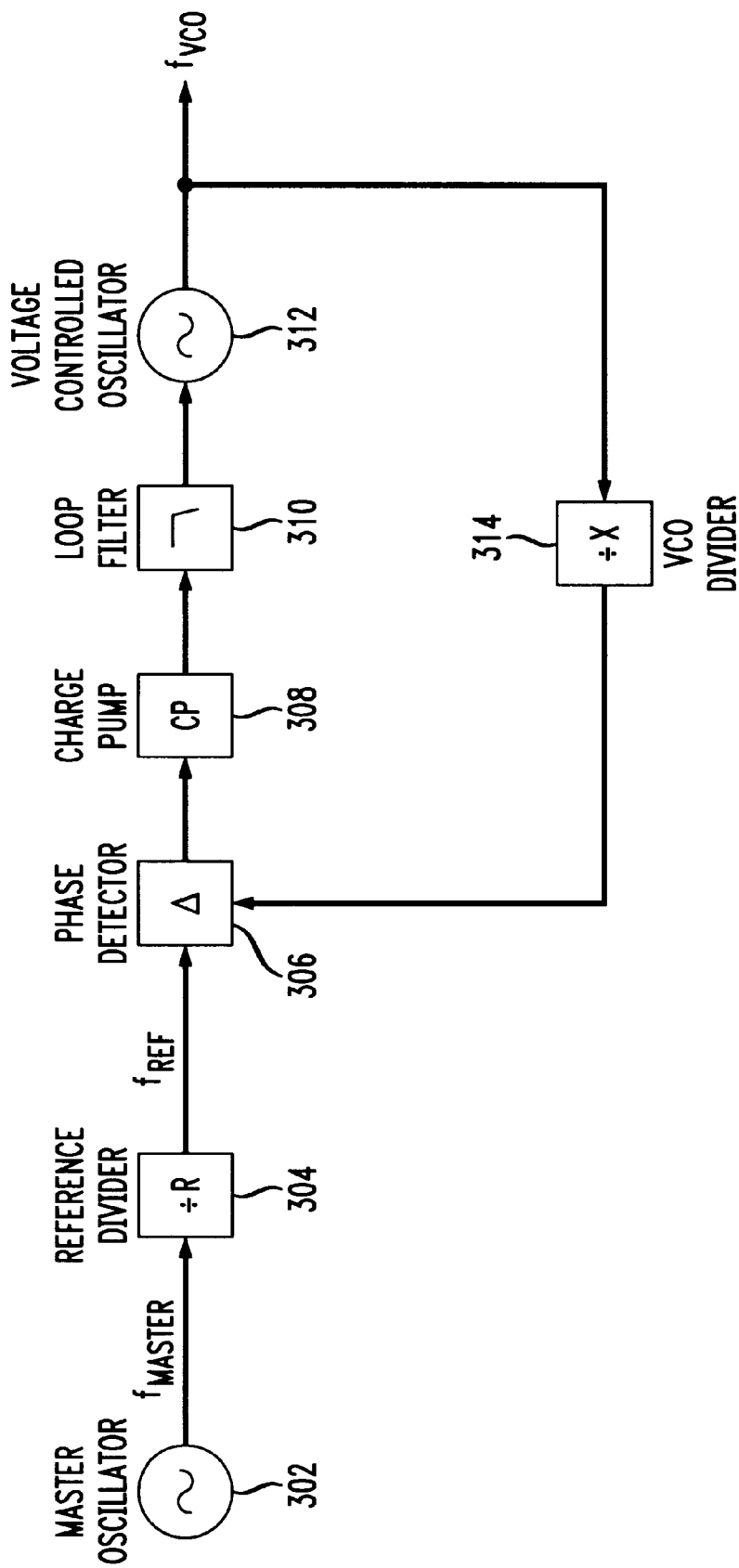
FIG. 3 shows a conventional PLL frequency synthesizer.

In particular, in FIG. 1, the conventional reference divider 304 (FIG. 3) in the input path to the digital PLL frequency synthesizer is replaced with a reference DDS divider 104, and/or the conventional VCO divider 314 (FIG. 3) is replaced with a second DDS divider 114 and an optional pre-scaler 116. Moreover, the phase detector 306 (FIG. 3) is instead implemented as a phase detector 106 having n-bit wide digital comparator with sign/magnitude outputs. Inputs to the phase detector 106 are the n-bit instantaneous phase values output from the phase accumulators in each DDS 104, 114.

Preferably, anti-alias filters are not necessary before the inputs to the phase detector 106 because the phase detector is a discrete-time circuit.

The optional pre-scaler 116 divides the frequency signal output from the voltage controlled oscillator (VCO) 112 by a value P.

The output of the digital phase detector 106 is converted to an analog control voltage signal for input to the voltage controlled oscillator (VCO) 112.

One technique for controlling the VCO 112 is to apply the output of the sign/magnitude phase detector 106 to a current digital-to-analog converter (DAC) 154 capable of sourcing and sinking current with sufficient resolution for the application. In this case, it is preferred that the current DAC 154 be followed by a loop filter 110. The loop filter 110 would integrate the current output from the DAC 154 to provide the control input signal to the VCO 112, otherwise as in a conventional digital PLL.

Another technique for controlling the VCO 112 (if the system has a clock faster than the update rate of the phase detector 106) is to digitally pulse-width modulate a fixed-current charge pump based on the magnitude of the error from the phase detector 106.

New to the inventive digital PLL frequency synthesizer is a clock generator 152. The clock generator 152 drives the phase detector 106 and DAC 154 to set the PLL update rate. Thus, in accordance with the principles of the present invention, the update rate is no longer required to equal the reference frequency as in conventional digital PLL frequency synthesizers. A main function of the clock generator 152 is to prevent timing glitches.

The reference DDS frequency divider 104 and the VCO DDS frequency divider 114 are discrete time circuits operating on orthogonal time bases, i.e., the reference DDS frequency divider 104 is fixedly driven by the system master oscillator, and the VCO DDS divider 114 is driven by the VCO 112, which changes as the VCO 112 is re-tuned.

The phase detector 106 can be asynchronous, and can be governed by the master oscillator 102, the VCO 112, or some function of the two, as long as the output of the phase detector 106 is settled when applied for conversion by the DAC 154. Likewise, the input to the DAC 154 should not change while its output is being updated.

Derivation of the clock signals by the clock generator 152 from the master oscillator 102 to keep the update rate constant provides good loop performance and stable operation. Nevertheless, for the maximum benefit from the inventive techniques, it is advantageous to use as fast an update rate as possible, so long as the clock generator 152 ensures that the phase detector 106 and the DAC 154 are free of glitches.

The current DAC 154 is preferably chosen to be of sufficient resolution for the particular application. However, the current DAC 154 may be replaced with a discrete-time charge pump which is active for as many clock cycles as the magnitude word. This latter approach requires that a clock of higher frequency than the update rate be available.

In accordance with the principles of the present invention, the update rate of the digital PLL frequency synthesizer is not based on the frequency signal output from the reference divider in the input path (as in conventional digital PLL frequency synthesizer architectures). Rather, the update rate is based on fixed clock signals output from the clock generator 152, which utilizes the master clock and the output frequency, in accordance with the principles of the present invention.

With the update rate as high as practical, choice of the reference frequency, i.e., the frequency of the signal generated by the reference DDS divider 104, might seem arbitrary. However, this is not quite the case. Although the reference frequency signal output from the reference DDS divider 104 is no longer the update rate (as was the frequency signal output from the conventional reference divider 304 shown in FIG. 3), nor is it related to channel spacing. Instead, it must be chosen low enough to prevent aliasing due to the different time bases of the two DDSs 104, 114. Moreover, the reference frequency must also be high enough to ensure accurate multiplication to the VCO frequency. The reference frequency must also be chosen, along with the design of the DAC 154, such that routine phase differences neither saturate the DAC 154 nor under-drive it to create a grainy, noisy output signal from the VCO 112.

Figure 2:
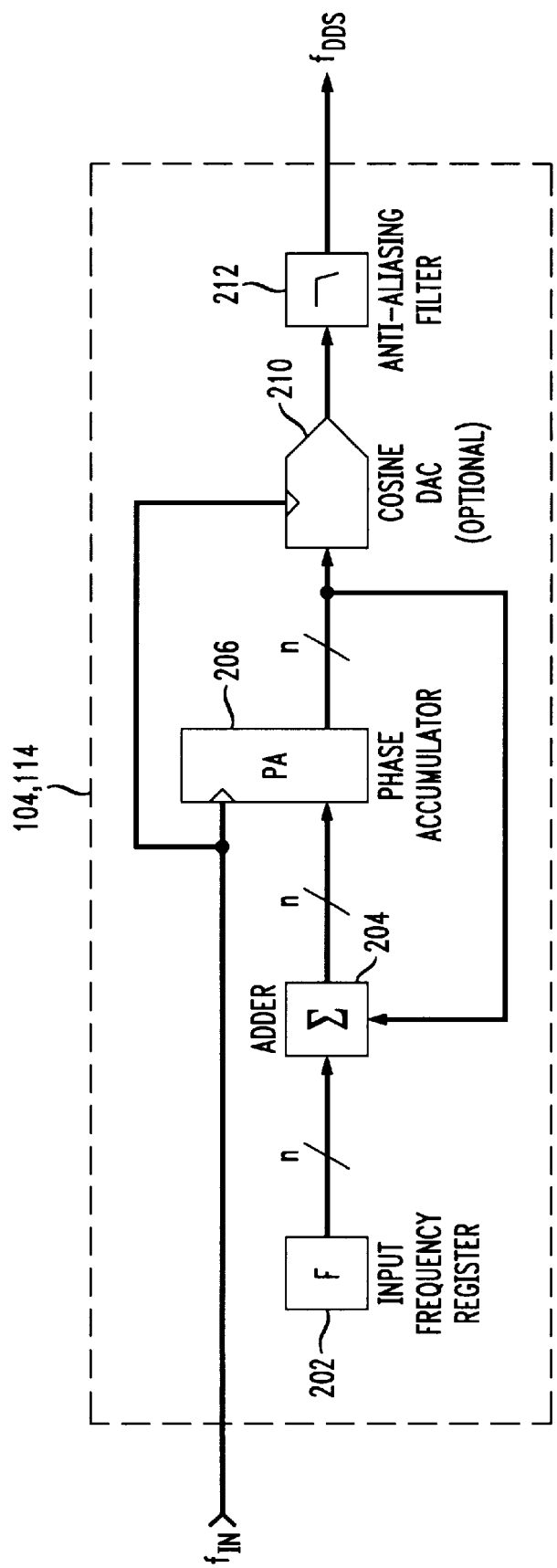
FIG. 2 shows an example of a direct digital synthesizer (DDS) used as either a VCO frequency divider in the feedback loop of a digital PLL frequency synthesizer and/or as a reference frequency divider in the input chain of a digital PLL frequency synthesizer, in accordance with the principles of the present invention.

FIG. 2 shows an example of a direct digital synthesizer (DDS) used as either a VCO frequency divider 114 in the feedback loop of a digital PLL frequency synthesizer and/or as a reference frequency divider 104 in the input chain of a digital PLL frequency synthesizer, in accordance with the principles of the present invention.

In particular, in FIG. 2, a direct digital synthesizer (DDS) is a discrete-value, discrete-time circuit useful for synthesizing a frequency lower than its input clock. The exemplary DDS shown in FIG. 2 comprises an n-bit frequency control register F 202, an n-bit adder 204, and an n-bit phase accumulator (PA) register 206. The DDS 104, 114 further includes an optional cosine-weighted DAC 210, and an anti-aliasing filter 212.

In operation, if a sinusoidal output is desired from the DDS, the value in the phase accumulator 206 is applied to the cosine-weighted DAC 210. The output of the cosine-weighted DAC 210 is preferably low pass filtered by the anti-aliasing filter 212 to remove aliases near harmonics of the input master oscillator frequency signal arising from the discrete time nature of the DDS 104, 114.

As an oscillator integrates frequency over time and outputs phase (or the cosine of phase), the DDS 104, 114 adds an n-bit integer value F from the input frequency register 202 to the contents already maintained in the n-bit phase accumulator 206 for each period of the input master oscillator clock signal. The overflow bit in the adder 204 is ignored, and the residue is stored in the phase accumulator 206.

The value stored in the phase accumulator 206 is a digital representation of the instantaneous phase of an oscillator having a frequency as defined by Equation (4) below:

$$f_{DDS} = \frac{F}{2^n} f_{IN}$$

Conventional phase detectors in PLLs determine phase between their two inputs by a high or low output (pump up or pump down, respectively) for the duration of which the rising edge of one input leads or lags the other, providing an update to a charge pump only once every reference cycle. However, in accordance with the principles of the present invention, the instantaneous phase values of the reference DDS divider 104 and the VCO DDS divider 114 are input to a digital sign/magnitude comparator in the phase accumulator 206 to allow an update rate as high as the speed of either DDS input clock. The sign/magnitude comparator in the phase accumulator 206 determines any difference in phase between the two respective input signals, and outputs a sign bit (analogous to a pump up or pump down signal) and a magnitude word (analogous to a duration or magnitude of the error signal).

With an n-bit reference DDS divider 104, the reference frequency output from the reference DDS divider 104 is shown in Equation (5) below:

$$f_{REF} = \frac{F_R}{2^n} f_{MASTER}$$

Alternatively derived from the VCO 112, the reference frequency output from the reference DDS divider 104 may be given by Equation (6) below:

$$f_{REF} = \frac{F_V}{P2^n} f_{VCO}$$

Solving Equations (5) and (6) for the frequency $f_{vco}$ output from the VCO 112 provides Equation (7) below:

$$f_{VCO} = \frac{PF_R}{F_V} f_{MASTER}$$

wherein the value maintained by the input frequency registers 202 in the reference DDS divider 104 and the VCO DDS divider 114 are represented as Fr and Fv, respectively, each of which is an n-bit integer.

EXAMPLE #1

A 900 MHz FHSS Cordless Telephone

As an example, consider a cordless telephone for use in the United States 902–928 MHz Industrial, Scientific, and Medical (ISM) band. In 26 MHz of bandwidth, a minimum of 64 channels may be required, giving a maximum channel spacing of about 400 KHz. A 10.24 MHz crystal may be used as the system master oscillator. With an R divider value of 26, a maximum reference frequency $f_{REF}$ of 393.8 KHz is attained. The PLL may be allowed, e.g., 250 microseconds to settle after each frequency change (hop), which may happen, e.g., twice every five (5) millisecond frame.

Updating the phase detector 106 and the DAC 154 at a master frequency of 10.24 MHz provides a 26-fold increase in the available update rate. A corresponding increase in loop bandwidth reduces the settling time to under 10 microseconds. Thus, the settling time requirement may be decreased, e.g., from 10% of the frame to less than 1%. Additionally, performance may be improved by slowing the bit rate to use the recovered frame time, and/or by increasing bit energy, improving range.

EXAMPLE #2

An FSK Modulator

It is also possible to rapidly reprogram either the reference DDS divider 104 and/or the VCO DDS divider 114 to form the basis of an FM or FSK modulator.

For instance, a digital PLL frequency synthesizer in accordance with the principles of the present invention may be implemented to provide a fast settling time and may be used to form the basis for an FSK modulator by reprogramming either the reference DDS divider 104 and/or the VCO DDS divider 114 to generate the desired tones at the transmitted bit rate.

The respective input frequency registers 202 of each of the DDS dividers 104, 114 may be replaced by two or more registers whose contents provide the desired tones. In this case, the desired tones can be multiplexed to the adder 204 of the respective DDS divider 104, 114 under the control of the bit stream. This technique would allow the digital PLL frequency synthesizer to have a wide bandwidth for fast settling times yet enjoy low phase noise, and a means for directly modulating the VCO 112 with extremely repeatable frequency deviation. Loop filter bandwidth can be chosen to provide filtering of the FSK tones, if desired.

Another way to view the modulator is in two parts: the reference DDS modulator and a very wide bandwidth frequency multiplier. Frequency may be modulated by changing the digital word input to the adder 204. It is also possible to precede the adder 204 with a filter, e.g., a digital signal processor (DSP) filter, to control transmitted bandwidth.

The pre-scaler 116 and VCO DDS divider 114 may be set to a fixed divide ratio, and the frequency multiplication factor may be set with the loop bandwidth being greater than the DSP filter bandwidth to ensure that the modulation is not distorted by further filtering. Since the update rate is fixed by (some function of) the master oscillator frequency, the loop dynamics are not affected by changing the reference frequency, as would be the case in a conventional digital PLL frequency synthesizer where reference frequency is equal to the update rate.

A digital phase locked loop including a DDS divider 114 in a feedback loop and/or a DDS divider 104 in an input path in accordance with the principles of the present invention has many uses. For example, the DDS PLL may be used in any transmitter and/or receiver which requires a local oscillator, e.g., as in cordless telephony, wireless voice or data, cable TV (CATV), wired data transmission, modem, and/or satellite TV. Moreover, it is particularly applicable to those applications where fast settling times are advantageous, e.g., frequency hopped spread spectrum (FHSS) communications, or those applications where direct modulation is advantageous, as in many systems with FSK modulation schemes. As another example, the DDS PLL may be used in any test equipment or other device which benefits from high resolution frequency control and/or from the ability to settle in on a new frequency very rapidly.

While the invention has been described with reference to the exemplary embodiments thereof, those skilled in the art will be able to make various modifications to the described embodiments of the invention without departing from the true spirit and scope of the invention.

What is claimed is:

1. A digital phase locked loop frequency synthesizer, comprising:
    a phase detector receiving at a first input a representation of a master frequency signal;
    a digital-to-analog converter receiving an output of said phase detector;
    a voltage controlled oscillator receiving an output of said digital-to-analog converter; and
    a VCO direct digital synthesizer in a feedback loop between an output of said voltage controlled oscillator and a second input to said phase detector, said VCO direct digital synthesizer forming a first frequency divider.

2. The digital phase locked loop frequency synthesizer according to claim 1, further comprising:
    a reference direct digital synthesizer between said master frequency signal and said first input of said phase detector, said reference direct digital synthesizer forming a second frequency divider.

3. The digital phase locked loop frequency synthesizer according to claim 2, further comprising:
    a loop filter between said phase detector and said voltage controlled oscillator.

4. The digital phase locked loop frequency synthesizer according to claim 2, further comprising:
    a pre-scaler in said feedback loop between said output of said voltage controlled oscillator and an input to said VCO direct digital synthesizer frequency divider.

5. The digital phase locked loop frequency synthesizer according to claim 3, further comprising:
    a pre-scaler in said feedback loop between said output of said voltage controlled oscillator and an input to said VCO direct digital synthesizer frequency divider.

6. The digital phase locked loop frequency synthesizer according to claim 1, further comprising:
    a loop filter between said phase detector and said voltage controlled oscillator.

7. The digital phase locked loop frequency synthesizer according to claim 1, further comprising:
    a charge pump between an output of said phase detector and an input to said voltage controlled oscillator.

8. The digital phase locked loop frequency synthesizer according to claim 1, wherein:
    said VCO direct digital synthesizer outputs words having at least two bits.

9. The digital phase locked loop frequency synthesizer according to claim 2, wherein:
    said reference direct digital synthesizer outputs words having at least two bits.

10. A method of providing feedback between an output signal of a voltage controlled oscillator and an input signal to a phase detector in a digital phase locked loop, comprising:

dividing said output signal from said voltage controlled oscillator with a VCO direct digital synthesizer having at least two-bit word length output samples; and providing said divided output signal to said input of said phase detector.

11. The method of providing feedback between an output signal of a voltage controlled oscillator and an input signal to a phase detector in a digital phase locked loop according to claim 10, further comprising:

dividing a master reference frequency signal with a reference direct digital synthesizer; and providing said divided master frequency signal to another input of said phase detector.

12. The method of providing feedback between an output signal of a voltage controlled oscillator and an input signal to a phase detector in a digital phase locked loop according to claim 11, further comprising:

comparing a phase of said divided feedback signal output from said VCO direct digital synthesizer to a phase of a divided representation of a master input frequency signal output from said reference direct digital synthesizer to determine a difference therebetween.

13. The method of providing feedback between an output signal of a voltage controlled oscillator and an input signal to a phase detector in a digital phase locked loop according to claim 12, further comprising:

changing a frequency of said output signal from said voltage controlled oscillator in accordance with said determined difference.

14. The method of providing feedback between an output signal of a voltage controlled oscillator and an input signal to a phase detector in a digital phase locked loop according to claim 10, further comprising:

pre-scaling said output signal from said voltage controlled oscillator before said step of dividing said output signal from said voltage controlled oscillator with said VCO direct digital synthesizer.

15. Apparatus for providing feedback between an output signal of a voltage controlled oscillator and an input signal to a phase detector in a digital phase locked loop, comprising:

means for dividing said output signal from said voltage controlled oscillator with a VCO direct digital synthesizer having at least two-bit word length output samples; and means for providing said divided output signal to said input of said phase detector.

16. The apparatus for providing feedback between an output signal of a voltage controlled oscillator and an input signal to a phase detector in a digital phase locked loop according to claim 15, further comprising:

means for dividing a master reference frequency signal with a reference direct digital synthesizer; and means for providing said divided master frequency signal to another input of said phase detector.

17. The apparatus to provide feedback between an output signal of a voltage controlled oscillator and an input signal to a phase detector in a digital phase locked loop according to claim 16, further comprising:

means for comparing a phase of said divided feedback signal output from said VCO direct digital synthesizer to a phase of a divided representation of a master input frequency signal output from said reference direct digital synthesizer to determine a difference therebetween.

18. The apparatus to provide feedback between an output signal of a voltage controlled oscillator and an input signal to a phase detector in a digital phase locked loop according to claim 17, further comprising:

means for changing a frequency of said output signal from said voltage controlled oscillator in accordance with said determined difference.

19. The apparatus to provide feedback between an output signal of a voltage controlled oscillator and an input signal to a phase detector in a digital phase locked loop according to claim 15, further comprising:

means for pre-scaling said output signal from said voltage controlled oscillator before said step of dividing said output signal from said voltage controlled oscillator with said VCO direct digital synthesizer.

20. A digital phase locked loop frequency synthesizer, comprising:

a master oscillator, a reference direct digital synthesizer adapted to accept as input an output of said master oscillator;

a phase detector receiving at a first input a representation of a master frequency signal;

a digital-to-analog converter receiving an output of said phase detector;

a voltage controlled oscillator receiving an output of said digital-to-analog converter; and a VCO direct digital synthesizer in a feedback loop between an output of said voltage controlled oscillator and a second input to said phase detector, said VCO direct digital synthesizer forming a first frequency divider.

* * * * *